US007751715B2

(12) United States Patent
Takami et al.

(10) Patent No.: US 7,751,715 B2
(45) Date of Patent: Jul. 6, 2010

(54) OPTICAL TRANSMISSION SYSTEM, OPTICAL RECEIVER, AND ITS GAIN ADJUSTMENT METHOD

(75) Inventors: Masayuki Takami, Fuchu (JP); Mototaka Kitajima, Tachikawa (JP); Yoshiki Namba, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 608 days.

(21) Appl. No.: 11/808,214

(22) Filed: Jun. 7, 2007

(65) Prior Publication Data

US 2007/0286601 A1    Dec. 13, 2007

(30) Foreign Application Priority Data

Jun. 7, 2006    (JP)    ............................. 2006-158912

(51) Int. Cl.
     *H04B 10/00*    (2006.01)
(52) U.S. Cl. .................................................. 398/115
(58) Field of Classification Search ................. 398/115, 398/202
     See application file for complete search history.

(56) References Cited

U.S. PATENT DOCUMENTS

| 5,854,702 | A | 12/1998 | Ishikawa et al. |
| 6,169,619 | B1 | 1/2001 | Ide |
| 6,801,767 | B1* | 10/2004 | Schwartz et al. .......... 455/426.2 |
| 2004/0096222 | A1* | 5/2004 | Cagenius .................... 398/115 |
| 2004/0253003 | A1 | 12/2004 | Farmer et al. |
| 2007/0243899 | A1* | 10/2007 | Hermel et al. ........... 455/553.1 |

FOREIGN PATENT DOCUMENTS

| EP | 1615359 A3 | 6/2006 |
| JP | 9-55705 | 2/1997 |

OTHER PUBLICATIONS

United Kingdom Intellectual Property Office Search Report for Application No. GB 0710849.1, Oct. 5, 2007.

* cited by examiner

*Primary Examiner*—Quan-Zhen Wang
(74) *Attorney, Agent, or Firm*—Finnegan, Henderson, Farabow, Garrett & Dunner, L.L.P.

(57) ABSTRACT

An optical transmission system comprises master unit and remote unit, the master unit includes optical transmitter transmits the optical signal to the optical fiber at a fixed averaged output level, the remote unit includes optical receiver receives optical signal via optical fiber, and optical receiver includes light receiving element converts optical signal into electric signal, variable gain amplifier amplifies the electric signal at a gain corresponding to a value of a given adjustment voltage, gain controller supplied power for, a defined control period, controls the adjustment voltage to stabilize an averaged level of the electric signal to a defined value, and feed-forward-controls a gain of variable gain amplifier, a shut off unit shuts off supply of power to the gain control circuit when the control period ends, and a keeping unit keeps a value of an adjustment voltage applied to the variable gain amplifier.

15 Claims, 5 Drawing Sheets

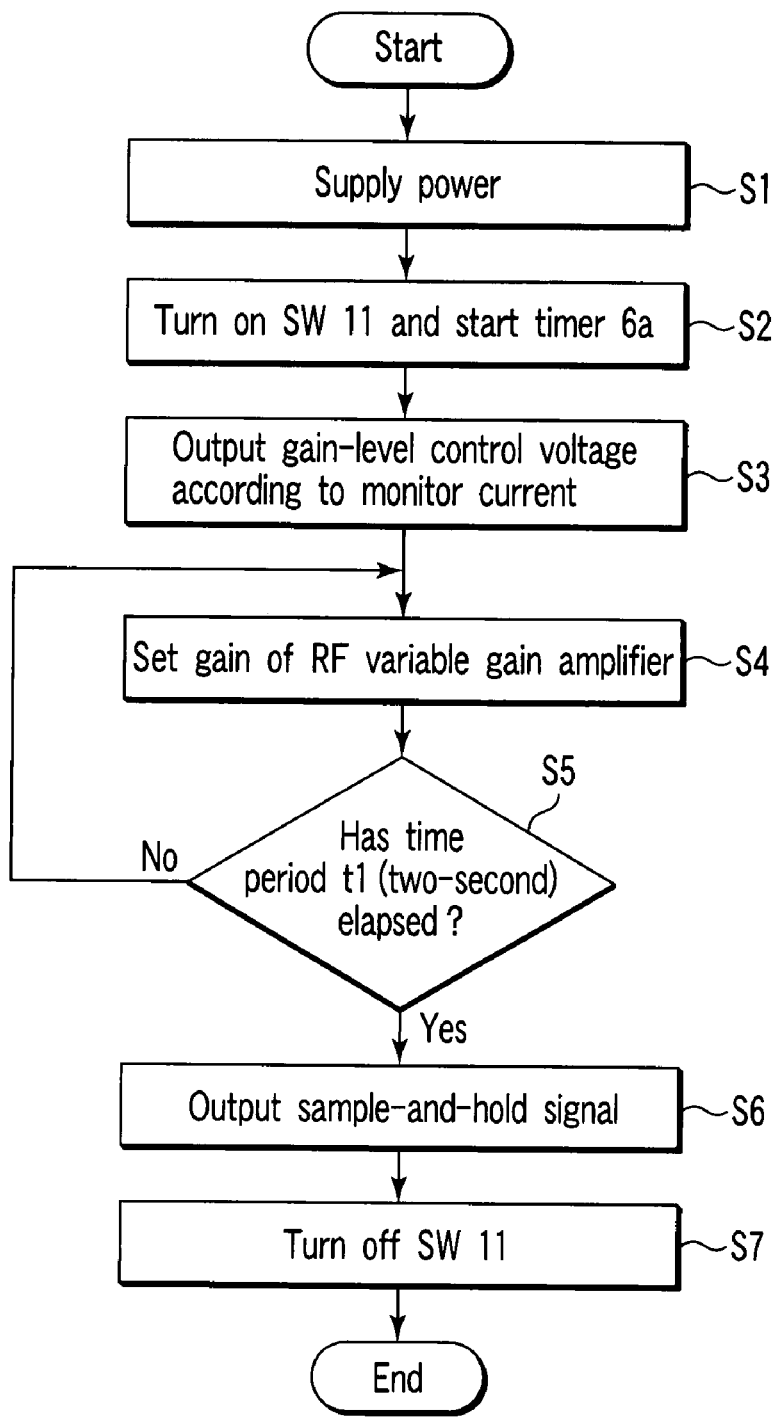
F I G. 4

OPTICAL TRANSMISSION SYSTEM, OPTICAL RECEIVER, AND ITS GAIN ADJUSTMENT METHOD

CROSS-REFERENCE TO RELATED APPLICATIONS

This application is based upon and claims the benefit of priority from prior Japanese Patent Application No. 2006-158912, filed Jun. 7, 2006, the entire contents of which are incorporated herein by reference.

BACKGROUND OF THE INVENTION

1. Field of the Invention

The present invention relates to an optical transmission system, an optical receiver for use in the system, and its gain adjustment method.

2. Description of the Related Art

An optical transmission method is usable in order to expand a service area of a mobile communication system. In other words, distributing radio frequency signals (hereinafter, referred to as radio signals) eliminated from a base station of the mobile communication system to a remote place via an optical fiber enables expanding its service providing area. Such a system has been known as a radio-over-fiber (ROF) system. The optical fiber being small in transmission loss, the ROF system can dispose a large number of remote units to re-emit radio signals over a range of several km.

FIG. 1 is a block diagram illustrating an existing ROF system. In FIG. 1, a master unit 200 and a remote unit power supply device 300 are disposed near by a base station 100. The master unit 200 sends and receives radio signals in uplink/downlink to and from the base station 100. Monitor control signals which controls the master unit 200 and the power supply device 300 are also transmitted and received between the base station 100 and the master unit 200.

The master unit 200 is connected to a plurality of remote units 500 (#1-#n) via optical fiber cables 400. The optical fibers 400 transmit radio signals converted into optical signals. The ROF system includes the optical fibers 400 for each uplink/downlink sometimes, and conversely, it shares a single optical fiber 400 in the uplink/downlink in the use of a wave-length multiplex technique sometimes.

Remote units 500 are supplied power from the remote unit power supply devices 300 disposed near by the master unit 200 through power cables 600. In recent years, since the number of remote units has become several hundreds, the power consumption of each remote unit 500 should be suppressed. If the power consumption at each remote unit 500 is large, the power supply device 300 must be large in capacity, increasing the cost of the equipment. In addition to this, the operating cost increases, caused by the increase in power consumption.

The smaller the power consumption for each remote unit 500 is, the larger the operating margin of the power supply device 300 becomes, so that the ROF system easily copes with an increase in the number of remote units 500. Thus it is important to suppress the power consumption of each remote unit 500 as much as possible.

Meanwhile, transmission paths of the optical fibers 400 have great variety in length, and transmission losses of optical signals vary for each remote unit 500. Therefore, optical output levels of optical transmitters equipped for the remote units 500, and light reception gains of optical receivers, etc., are automatically adjusted on the basis of the received light levels.

The transmission loss of the optical fiber cable 400 which has constructed once hardly varies. Therefore, in transmitting the optical signals, the system operates an output automatic adjustment function to quit a light reception gain adjustment function. The system, in receiving the optical signals, operates the light reception gain adjustment function to quit the output automatic adjustment function. Like this, a technique which operates either a transmission power adjustment function or a reception gain adjustment function in response to the transmission and reception of the optical signals to decrease the power consumption has been proposed (for example, JP-A H9-55705 (KOKAI)

BRIEF SUMMARY OF THE INVENTION

In the conventional technique, however, the ROF system requiring a switch to switch the transmission power adjustment function and the reception gain adjustment function, the configurations of the master unit 200 and the remote unit 500 become complicated, and the control therefor also becomes troublesome. Besides, the economy in power consumption in the ROF system results in disappointing.

An object of the present invention is to provide an optical transmission system which has a simple configuration to reduce power consumption, an optical receiver for use in the system, and its gain adjustment method.

According to an aspect of the present invention, there is provided an optical transmission system which is provided with a master unit and a remote unit connected with each other via an optical fiber, and interactively transmits an optical signal modulated by a radio signal to be used for a radio area communication in a mobile communication system between the master unit and the remote unit, wherein the master unit includes an optical transmitter which transmits the optical signal to the optical fiber at a fixed averaged optical output level, the remote unit includes an optical receiver which light-receives the optical signal incoming via the optical fiber, and the optical receiver includes: an light receiving element which converts the optical signal into an electric signal to reproduce the radio signal; a variable gain amplifier which amplifies the reproduced radio signal at a gain corresponding to a value of a given adjustment voltage; a gain control circuit which is supplied power for a defined control period to be driven, controls the adjustment voltage so as to stabilize an averaged level of the reproduced radio signal to a defined value, and feed-forward-controls a gain of the variable gain amplifier; a shut off unit which shuts off supply of power to the gain control circuit when the control period ends; and a keeping unit which keeps a value of an adjustment voltage applied to the variable gain amplifier at the time when the supply of the power to the gain control circuit is shut off.

Additional advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 4 is an exemplary flowchart illustrating an operation procedure of the optical receiver in FIG. 3.

DETAILED DESCRIPTION OF THE INVENTION

First Embodiment

Figure 1:
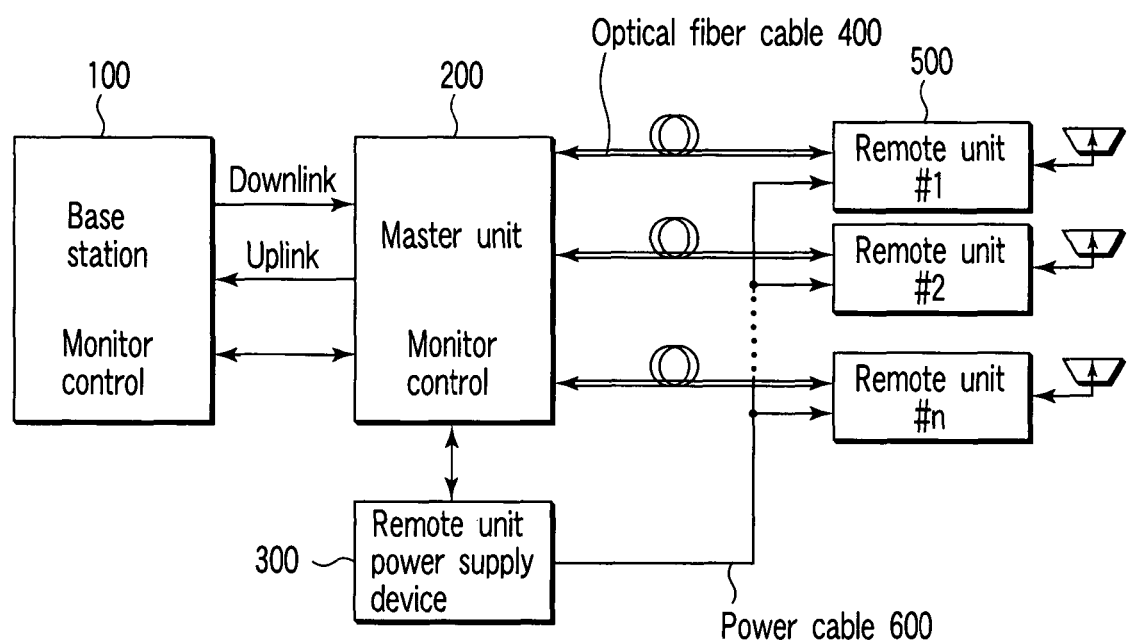
FIG. 1 is an exemplary block diagram illustrating a conventional ROF system.
Figure 2:
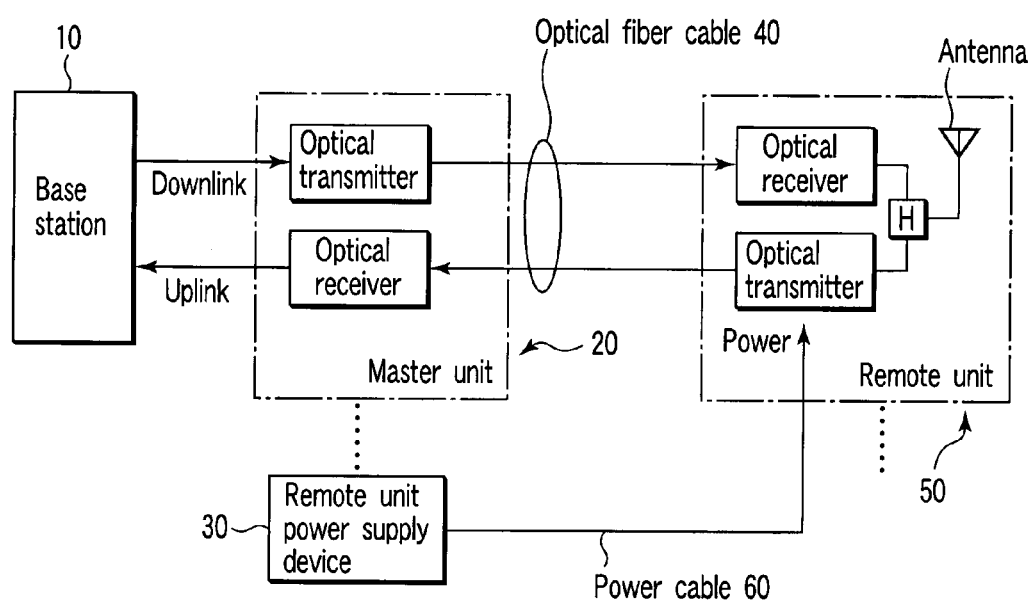
FIG. 2 is an exemplary block diagram of a ROF system regarding an embodiment of the present invention.

FIG. 2 is a functional block diagram depicting an ROF system regarding the first embodiment of the invention. In FIG. 2, a remote unit power supply device 30 supplies power to a remote unit 50 through a power cable 60. A master unit 20 and remote unit 50 are provided with optical transmitters OS and optical receivers OR, respectively. The optical transmitter OS of the master unit 20 is connected to the optical receiver OR of the remote unit 50 via an optical fiber cable 40. Thereby, a channel of a downlink is established. The optical transmitter OS of the remote unit 50 is connected to the optical receiver OR via the optical fiber cable 40. Thereby, a channel of an uplink is established.

The master unit 20 and the remote unit 50 each have the optical transmitters OS and the optical receivers OR, and convert radio signals into optical signals among the optical transmitters OS and the optical receivers OR facing one another. The optical fiber cable 40 transmits an optical signal strongly modulated by an RF radio signal.

The optical receiver OR of each of the master unit 20 and the remote unit 50 adjusts a light reception gain by means of a feed-forward-control in response to an attenuation level of the optical signal on the optical fiber cable 40. That is to say, the optical transmitter OS transmits the optical signal to the optical fiber cable 40 with a preset averaged level. The optical receiver OR measures an averaged light reception level of the optical signal and automatically adjusts the light reception gain so that the optical level in a state in which the optical signal converted into an electric signal becomes a defined value. The optical transmitter OS not having to adjust the output level of output light, in either of the master unit 20 and the remote unit 50 can decrease the size of the optical transmitters OS and can reduce the power consumption.

Figure 3:
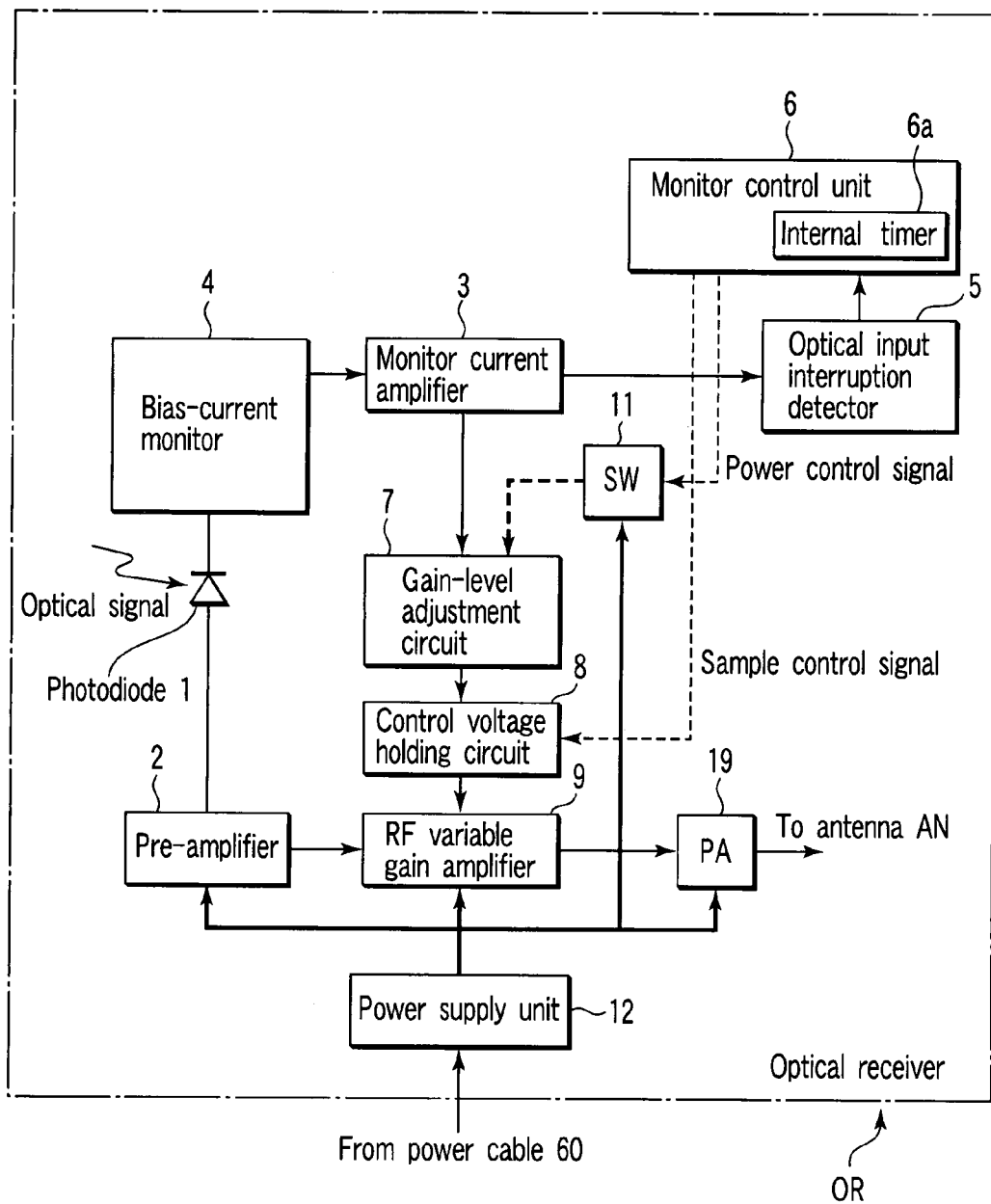
FIG. 3 is an exemplary functional block diagram illustrating an optical receiver OR of a remote unit 50 in FIG. 2.

FIG. 3 is a functional block diagram depicting the optical receiver OR of the remote unit 50 in FIG. 2. The optical receiver OR of FIG. 3 comprises a photodiode 1, a pre-amplifier 2, a bias-current monitor 3, a monitor current amplifier 4, an optical input interruption detector 5, a monitor control unit 6, gain-level adjustment circuit 7, a control voltage holding circuit 8, an RF variable gain amplifier 9, a power amplifier (hereinafter, referred to as a PA) 19, a switch (hereinafter, referred to as an SW) 11, and a power supply unit 12.

The SW 11 is disposed on a power supply line from the power supply unit 12 to the gain-level adjustment circuit 7. Thereby, the drive power for the adjustment circuit 7 is supplied thereto only while the SW 11 is on. The photodiode 1 converts the optical signal arriving through the optical fiber cable 40 into the electric signal. The pre-amplifier 2 amplifies the electric signal to input it to the gain amplifier 9.

The bias-current monitor 3 converts the averaged level of the electric signal from the photodiode 1 into a direct current level signal to output it as a monitor signal. The monitor signal is amplified by a monitor current amplifier 4 and input to the interruption detector 5 and the adjustment circuit 7. The interruption detector 5 monitors the reception level of the optical signal to notify the monitor result to the monitor control unit 6. The adjustment circuit 7 generates an adjustment voltage to adjust the light reception gain by a strength based on the level of the monitor signal. The strength of the adjustment voltage is preset in order to compensate the attenuation on the optical fiber cable 40. The adjustment voltage is applied to the gain amplifier 9 through the holding circuit 8.

The gain amplifier 9 amplifies the electric signal input from the pre-amplifier 2 by the gain based on the adjustment voltage from the holding circuit 8. The gain amplifier 9 thereby applies feed-forward control to its gain. The output from the gain amplifier 9 is further amplified by the PA 19 up to the prescribed power to be output to the antenna AN.

FIG. 4 is a flowchart depicting an operation procedure of the optical receiver OR in FIG. 3. In FIG. 4, when power is supplied from the remote unit power supply device 30, the power supply unit 12 is turned on (step s1). The monitor control unit 6 then starts an internal timer 6a and also turns on the SW 11 (step s2).

At this moment, the gain-level adjustment circuit 7 outputs a gain-level control voltage of a voltage corresponding to a monitor current from the monitor current amplifier 4 (step s3). The gain-level control voltage is applied to the RF variable gain amplifier 9 through the control voltage holding circuit 8, and the gain of the RF variable gain amplifier 9 is set (step s4). Thereby, feed-forward-control is carried out.

The monitor control unit 6 waits the elapse of a defined time period t1 (for example, 2 seconds) from this state on the basis of the count value of the internal timer 6a (step s5). After the elapse of time period t1, the monitor control unit 6 outputs a sample control signal to the holding circuit 8 (step s6). The time period t1 is enough to stably set the gain of the holding circuit 8.

The holding circuit 8 is, for instance, a sample-and-hold circuit. When a sample control signal is supplied, for example, if a gain-level control voltage of 1.5V has been applied from the adjustment circuit 7 to the holding circuit 8, after this time point, the control voltage of 1.5V is applied continuously to the gain amplifier 9. The gain amplifier 9 amplifies a radio signal with a gain of, for example, 55.5 db corresponding to the gain-level control voltage of 1.5V.

On completing sample-and-hold processing (for example, after 2.5 seconds), the monitor control unit 6 supplies a power supply control signal to the SW 11 to turn off the SW 11 (step s7). The adjustment circuit 7 then stops its operation. Thereby, the optical receiver OR can reduce the power consumption thereof.

As given above, in the first embodiment, the optical receiver OR, which receives the optical signal transmitted from the optical transmitter OS to transmit an optical signal with a constant average level, includes the monitor control unit 6, the control voltage holding circuit 8, and the SW 11. The power supply unit 12 supplies the power to the adjustment circuit 7 through the SW 11. The SW 11 is turned on only the time period immediately after the power is supplied until the time period t1 is elapsed, and the gain of the gain amplifier 9 is stabilized by the feedforward system within this time period. After this, the SW 11 is turned off, and the control voltage with a constant level is applied from the holding circuit 8 to the gain amplifier 9.

The conventional technique, for instance, feedback-controls the light reception gain of the optical receiver so as to make a reproduction level of a pilot signal included in an optical signal at the optical receiver constant. However, the optical receiver having to turn on the gain control function at all times, it consumes a large volume of power.

Conversely, the ROF system in the first embodiment aims at the fact that the optical fiber cable itself is stable in attenuation characteristic, and that the output optical level from the optical transmitter is also stabilized. In other words, the inventor of the present invention turns its attention to the fact that there is no need to conduct feedback control on a light receiving side at all times. Therefore, in the first embodiment, the ROF system sets the light reception gain by means of the feedforward control at, for instance, immediately after supplying power to the optical receiver. After that time, the optical receiver does not control the gain to maintain the value of the gain constant. The optical receiver thereby can reduce its power consumption.

Second Embodiment

Figure 5:
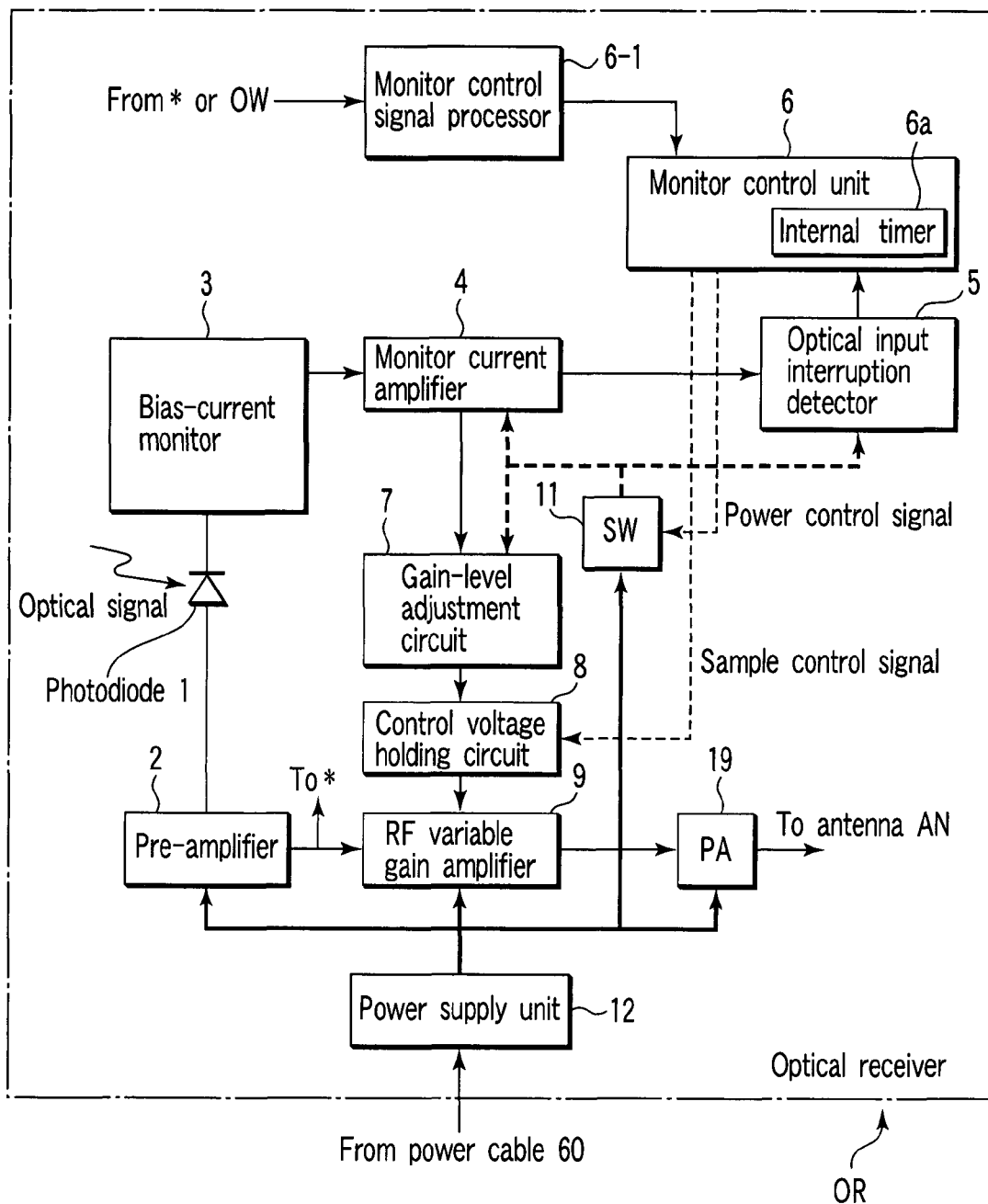
FIG. 5 is an exemplary functional block diagram illustrating another example of the optical receiver in FIG. 2.

FIG. 5 is a functional block diagram showing the optical receiver OR of the remote unit 50 in FIG. 2. In general, the ROF system includes a monitor center to integrally control the system. The monitor center sends a variety of commands to each remote unit 50 through the master unit 20. In the second embodiment, the ROF system automatically controls the light reception gain by means of feedforward processing at the timing at which the remote units 50 receive the commands. The commands each include poling signals and reset signals.

The optical receiver OR in FIG. 5 has a monitor control signal processor 6-1. The command is included in a monitor control signal transmitted from the master unit 20 to the remote unit 50 to be given to the optical receiver 50. The monitor control signal is multiplexed on the optical signal, or transmitted from the master unit 20 to the remote unit 50 via an order wire that is an exclusive channel. The monitor control signal processor 6-1 extracts a poling command or a reset command from the received monitor control signal to notify the command to the monitor control unit 6.

In such a configuration, the monitor control unit 6 also conducts the control regarding the feedforward control of the light reception gain in addition to the conduct of processing defined by the command. That is, when receiving the polling command, or the reset command, the monitor control unit 6 turns on the SW 11 as well as starts the internal timer 6a. After this time, the optical receiver goes on the procedure similar to that of steps s2 to s7 in FIG. 4.

Furthermore, in the second embodiment, in addition to the configuration of FIG. 2, the SW 11 is also disposed on the power supply line leading to the monitor current amplifier 4 and the optical input interruption detector 5 from the power supply unit 12. Thereby, each drive power for the monitor current amplifier 4 and the optical input interruption detector 5 is supplied to the two only while the SW 11 is turned on. That is to say, in the second embodiment, the ROF system carries out the determination of the presence or absence of the optical input interruption only while the light reception gain is controlled. Thereby, not having to turn on the monitor current amplifier 4 and the optical input interruption detection circuit 5 at all times, the ROF system can enhance the power saving effect in a level superior to that of the first embodiment.

As mentioned above, in the first and the second embodiments, the light reception gains of the optical receivers OS are set in the feedforward systems, and after the setting, they decrease the power consumption by turning on their attention to the facts that the characteristics of the optical fiber cables 40 are stable to turn off their control loops. Thus, in accordance to the present invention, an ROF system in which power consumption is reduced, an optical receiver to be used for the system, and its gain adjustment method can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An optical transmission system which is provided with a master unit and a remote unit connected with each other via an optical fiber, and interactively transmits an optical signal modulated by a radio signal to be used for a radio area communication in a mobile communication system between the master unit and the remote unit, wherein
the master unit includes an optical transmitter which transmits the optical signal to the optical fiber at a fixed averaged optical output level,
the remote unit includes an optical receiver which light-receives the optical signal incoming via the optical fiber, and
the optical receiver includes:
an light receiving element which converts the optical signal into an electric signal to reproduce the radio signal;
a variable gain amplifier which amplifies the reproduced radio signal at a gain corresponding to a value of a given adjustment voltage;
a gain control circuit which is supplied power for a defined control period to be driven, controls the adjustment voltage so as to stabilize an averaged level of the reproduced radio signal to a defined value, and feed-forward-controls a gain of the variable gain amplifier;
a shut off unit which shuts off supply of power to the gain control circuit when the control period ends; and
a keeping unit which keeps a value of an adjustment voltage applied to the variable gain amplifier at the time when the supply of the power to the gain control circuit is shut off.

2. The optical transmission system according to claim 1, wherein
the control period is a period after the remote unit is started until the adjustment voltage becomes stable.

3. The optical transmission system according to claim 1, further comprising:
a monitor control device which issues a command to the remote unit, wherein
the control period is a period after the command is issued to the remote unit until the adjustment voltage becomes stable.

4. The optical transmission system according to claim 3, wherein the command is superposed on the optical signal to be transmitted to the remote unit.

5. The optical transmission system according to claim 3, wherein
the command is transmitted to the remote unit via an order wire of a channel different from that of the radio signal.

6. An optical receiver which is provided for an optical transmission system equipped with a master unit and a remote unit connected with each other via an optical fiber, and light-receives an optical signal to be transmitted from the master unit to the optical fiber at a fixed averaged output level by the remote unit, comprising:

an light receiving element which converts the optical signal into an electric signal to reproduce a radio signal;

a variable gain amplifier which amplifies the reproduced radio signal at a gain corresponding to a value of a given adjustment voltage;

a gain control circuit which is supplied power for a defined control period to be driven, controls the adjustment voltage so as to stabilize an averaged level of the reproduced radio signal to a defined value, and feed-forward-controls a gain of the variable gain amplifier;

a shut off unit which shuts off supply of power to the gain control circuit when the control period ends; and a keeping unit which keeps a value of an adjustment voltage applied to the variable gain amplifier at the time when the supply of the power to the gain control circuit is shut off.

7. The optical receiver according to claim 6, wherein the control period is a period after the remote unit is started unit until the adjustment voltage becomes stable.

8. The optical receiver according to claim 6, wherein the optical transmission system further comprises:

a monitor control device which issues a command to the remote unit, and the control period is a period after the command is issued to the remote unit until the adjustment voltage becomes stable.

9. The optical receiver according to claim 8, wherein the command is superposed on the optical signal to be transmitted to the remote unit.

10. The optical receiver according to claim 8, wherein the command is transmitted to the remote unit via an order wire of a channel different from that of the radio signal.

11. A gain adjustment method of an optical receiver which is provided for an optical transmission system equipped with a master unit and a remote unit connected with each other via an optical fiber, and light-receives an optical signal to be transmitted from the master unit to the optical fiber at a fixed averaged output level by the remote unit, comprising:

converting the optical signal into an electric signal to reproduce a radio signal;

amplifying the reproduced radio signal at a gain corresponding to a value of a given adjustment voltage by means of a variable gain amplifier;

controlling the adjustment voltage so as to stabilize an averaged level of the reproduced radio signal to a defined value by a gain control circuit which is supplied power for a defined control period to be driven, and feed-forward-controlling a gain of the variable gain amplifier;

shutting off supply of power to the gain control circuit when the control period ends; and storing a value of an adjustment voltage applied to the variable gain amplifier at the time when the supply of the power to the gain control circuit is shut off.

12. The gain adjustment method according to claim 11, wherein the control period is a period after the remote unit is started until the adjustment voltage becomes stable.

13. The gain adjustment method according to claim 11, wherein the optical transmission system further comprises:

a monitor control device which issues a command to the remote unit, and the control period is a period after the command is issued to the remote unit until the adjustment voltage becomes stable.

14. The gain adjustment method according to claim 13, wherein the command is superposed on the optical signal to be transmitted to the remote unit.

15. The gain adjustment method according to claim 13, wherein the command is transmitted to the remote unit via an order wire of a channel different from that of the radio signal.

* * * * *